(12) United States Patent
Ui et al.

(10) Patent No.: US 6,297,134 B1
(45) Date of Patent: Oct. 2, 2001

(54) DEPOSITION OF TITANIUM OXIDE FILM CONTAINING DROPING ELEMENT ON SI SUBSTRATE

(75) Inventors: Koichi Ui, Kitakatsuragi-gun; Satoshi Okamoto, Ueno; Tohru Nunoi, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/553,148

(22) Filed: Apr. 20, 2000

(30) Foreign Application Priority Data

Apr. 21, 1999 (JP) .................................................. 11-113626

(51) Int. Cl.[7] .................................................. H01L 21/22
(52) U.S. Cl. .................................................. 438/563
(58) Field of Search .................................. 438/57, 61, 69, 438/72, 507, 508, 509, 558, 563; 136/256

(56) References Cited

FOREIGN PATENT DOCUMENTS

| 62-104081 A | 5/1987 | (JP) . |
|---|---|---|
| 8-85874 A | 4/1996 | (JP) . |

*Primary Examiner*—Keith Christianson
(74) *Attorney, Agent, or Firm*—Nixon & Vanderhye, P.C.

(57) ABSTRACT

A titanium oxide film containing a dopant element formed on a silicon substrate by supplying a titanium compound for forming the titanium oxide film and a compound of a dopant element for a silicon semiconductor in a gaseous state to a surface of the silicon substrate heated to a predetermined temperature, wherein the concentration of the dopant element in the titanium oxide film becomes progressively higher from the surface of the titanium oxide film to the surface of the silicon substrate.

5 Claims, 12 Drawing Sheets

DEPOSITION OF TITANIUM OXIDE FILM CONTAINING DROPING ELEMENT ON SI SUBSTRATE

CROSS-REFERENCE TO RELATED APPLICATION

This application is related to Japanese application No. HEI 11 (1999)-113626 filed on Apr. 21, 1999, whose priority is claimed under 35 USC § 119, the disclosure of which is incorporated by reference in its entirety.

BACKGROUND OF THE INVENTION

1. Field of the Invention

This invention relates to a titanium oxide film and a production apparatus of a titanium oxide film. More particularly, this invention relates to a titanium oxide film and a production apparatus of a titanium oxide film that will be used suitably for producing a crystalline silicon solar cell. The titanium oxide film of the present invention can be used suitably as an antireflection coating (ARC) of a solar cell.

2. Description of the Related Arts

A solar cell has a p-n junction and an ARC. The method of forming them is described in, for example, Japanese Unexamined Patent Publication No. HEI 8(1996)-085874.

A production process of a solar cell for a module employing a method of simultaneously forming a p-n junction and an ARC according to the prior art is illustrated in FIG. 9.

Ruggedness or trenches (hereinafter simply referred to as the "ruggedness") having a very fine level differences of several to dozens of microns are formed on a surface of a p type crystalline silicon substrate in order to reduce surface reflection on a light incident surface and to prevent a short-circuit current. This ruggedness can be formed, for example, by a texture etching method in which a substrate is etched using a mixed solution of an alcohol and an aqueous sodium hydroxide solution having a concentration of a few percents. A method of forming a large number of trenches by using a dicing device or laser, or dry etching may also by used (S11).

After the ruggedness is thus formed, a Phospho-Titanate Glass (PTG) film containing phosphorus as a dopant element is deposited on the surface of the substrate heated to about 200° C. to about 500° C. by an atmospheric pressure chemical vapor deposition (CVD) method by using titanium alkoxide and a phosphoric acid ester (S12).

Next, the substrate on which the PTG film is formed is heated at about 800° C. to about 1,000° C. in a nitrogen atmosphere. In consequence, phosphorus is diffused from the PTG film into the substrate so that a p-n junction in the substrate and an ARC are formed at the same time.

FIG. 10 shows a refractive index of the PTG film formed on the surface of the silicon substrate and a sheet resistance of the dopant element diffusion layer (n layer) after the film formation, relative to the substrate temperature employed for the formation of the PTG film according to the prior art. This film has a refractive index of about 1.6 to about 2.0. The atmospheric pressure CVD method can form a film having a uniform thickness. The PTG film functions as an ARC by interference. When the PTG film is heated at 900° C. in a nitrogen atmosphere for 30 minutes, the sheet resistance of the n layer is 50 to 500 $\Omega/\square$ (square). A solar cell adapted to a module can be obtained when the sheet resistance is not greater than 100 $\Omega/\square$ (S13).

Next, a titanium oxide film or the like having a higher refractive index than that of the PTG film is uniformly deposited on the PTG film by CVD method or the like. The refractive index of the titanium oxide film can be varied from about 1.8 to about 2.4 by changing the heating temperature of the silicon substrate within the range of 150 to 350° C., as described in Japanese Unexamined Patent Publication No. SHO 62(1987)-104081 (S14).

Next, an aluminum paste is applied to a back surface of the silicon substrate by screen printing method and then fired at about 700° C. to about 800° C. Thus, a back surface electrode made of aluminum is formed and a back surface field layer is formed by diffusing aluminum from the aluminum paste into the back surface of the substrate (S15).

Then, a silver paste is applied to a light incident surface by screen printing method and then fired to give a light incident surface electrode (hereinafter referred to as a grid electrode). Since a glass frit or the like is contained in the silver paste, the light incident surface comes into contact with the dopant element diffusion layer while penetrating through the titanium oxide film and the PTG film (S16).

A continuous atmospheric pressure CVD apparatus that can be used for forming the p-n junction and the reflection preventing film is described in Japanese Unexamined Patent Publication No. HEI 8(1996)-085874, for example. A dispersion head of the continuous atmospheric pressure CVD apparatus is constituted as shown in FIG. 11. An assembly 101 of the head includes a ceiling plate 102, four side plates (a forward side plate is not shown) 103 extending down from the periphery of the ceiling plate 102 and a large number of partition plates 104 interposed between the right and left side plates 103 with predetermined gaps between them. Two gas introduction ports 105 and 106 are provided on the backward side plate 103 between the ceiling plate 102 and the upper ends of the partition plates 104. A cooling plate 107 with a built-in piping for passing air as a coolant is fitted to the outer surface of each side plate 103.

For the film formation, gases containing the starting materials are introduced through the gas introduction ports 105 and 106 into a space between the ceiling plate 102 and the upper ends of the partition plates 104 and mixed together. The resulting mixed gas G is blown downward along the partition plates 104 and supplied to the surface of the silicon substrate 21 that travels below the assembly 101 while being conveyed by a conveyor belt 23. This gas G decomposes on the surface of the silicon substrate 21 and forms a film having a composition that corresponds to the kinds of the starting materials on the surface of the silicon substrate 21. The remaining gas is discharged from an exhaust port 110 to the outside through a gap 109 between the assembly 101 and a cover protuberance 108.

The temperature of the assembly 101 is adjusted to a temperature higher than the dew points of the starting materials but lower than the lower limit of the decomposition temperature of the starting materials by supplying air into the cooling plate 107 at a suitable flow rate.

When a phosphorus diffusion layer (dopant element diffusion layer) having a sheet resistance value of 50 to 100 $\Omega/\square$ is formed by the method of producing a solar cell described in Japanese Unexamined Patent Publication No. HEI 8(1996)-085874 as shown in FIG. 10, the refractive index of the resulting PTG film is from 1.6 to 2.0.

Where the light incident surface electrode is formed by using the silver paste, the loss of a series resistance becomes great due to the increase of the contact resistance. Therefore, a dopant element diffusion layer having a sheet resistance of not greater than about 60 $\Omega/\square$ must be formed to prevent the drop of a fill factor.

In many cases, the crystalline silicon solar cell is assembled in a so-called "super-straight type module". This module comprises a solar cell, a glass and a filler (generally EVA (ethylene vinyl acetate copolymer)) for protecting the light incident surface of the solar cell, a back surface material, a peripheral seal material and a frame member encompassing the periphery. To be assembled in the module, the glass and EVA are positioned on the light incident surface of the solar cell. For this reason, an ARC that has a refractive index different from a diffraction index in the case where the light incident surface of the solar cell keeps direct contact with air is required. Here, the optimum refractive index n of the reflection preventing film is given by $n=(n_0 \cdot n_s)^{1/2}$ provided that $n_s$ is the refractive index silicon and $n_0$ is the refractive index of the material of the reflection preventing film. In a wavelength range $\lambda=600$ to 1,100 nm, where the sensitivity of the solar cell is high, the refractive index $n_s$ of silicon is from about 3.5 to about 4. When the light incident surface of the solar cell keeps direct contact with air ($n_0=1$), the optimum refractive index of the reflection preventing film is 1.8 to 2.0. Where the glass and EVA exist on the light incident surface of the solar cell $n_0=1.4$ to 1.5), the optimum refractive index of the reflection preventing film is 2.2 to 2.5.

As can be seen also from FIG. 10, the PTG film (having a refractive index of about 1.6 to about 2.0) is somewhat low to be used as the reflection preventing film of the solar cell used for the module, so that it cannot effectively reduce the surface reflection. Therefore, it has been necessary to uniformly deposit a film having a higher refractive index than that of the PTG film such as a titanium oxide film on the PTG film by CVD method or the like.

SUMMARY OF THE INVENTION

The present invention provides a titanium oxide film containing a dopant element formed by supplying a titanium compound for forming the titanium oxide film and a compound of a dopant element for a silicon semiconductor in a gaseous state to a surface of a silicon substrate heated to a predetermined temperature, wherein the concentration of the dopant element in the titanium oxide film becomes progressively higher from the surface of the titanium oxide film to the surface of the silicon substrate.

The present invention also provides a production apparatus of a titanium oxide film, the apparatus comprising means for heating a silicon substrate, and a dispersion head for discharging independently a titanium compound in a gaseous state for forming a titanium oxide film, a compound of a dopant element for a silicon semiconductor in a gaseous state and an atmospheric gas, wherein a distance from bottom ends of discharge ports of the dispersion heads for the titanium compound and the atmospheric gas to the surface of the silicon substrate is greater than a distance from a bottom end of the discharge port of the dispersion head for the dopant element compound to the surface of the silicon substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
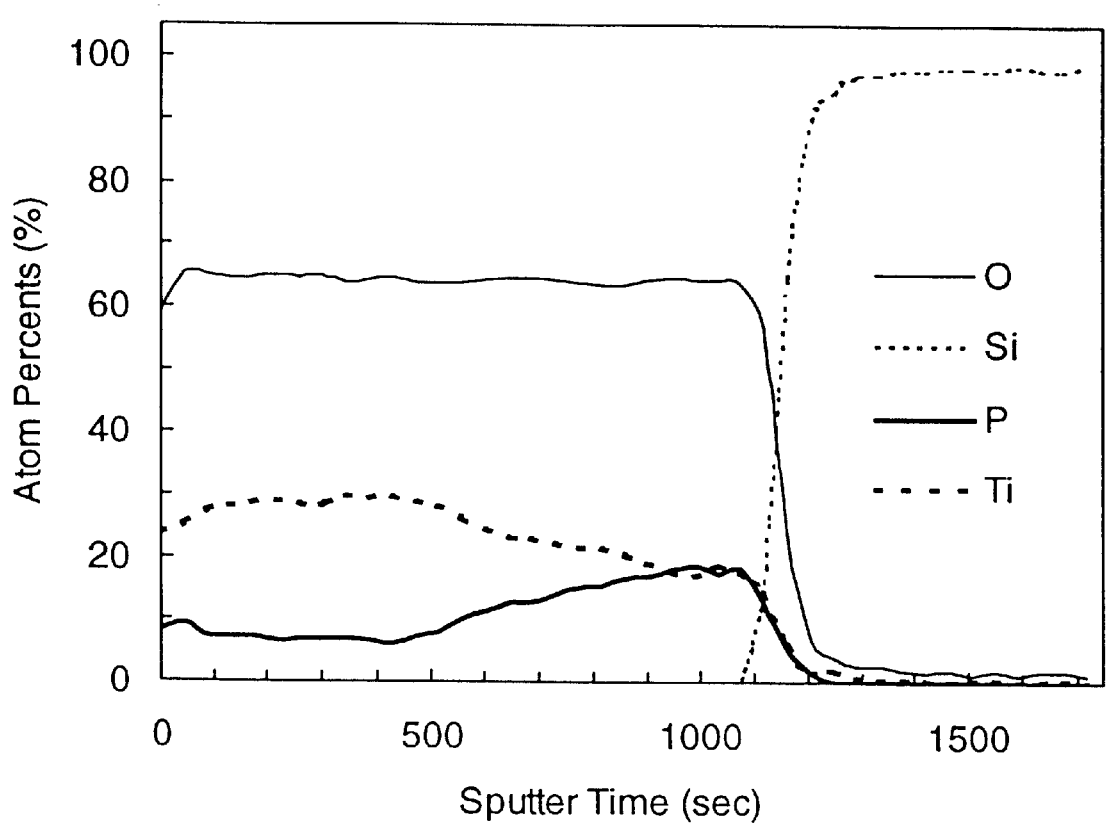
FIG. 1 is a graph illustrating a depth profile of an XPS analysis of a PTG film formed by a production apparatus of the present invention.

Examples of titanium compounds for forming a titanium oxide film include those titanium alkoxides which are in the form of liquid at normal temperature, such as tetraethoxytitanium, tetrapropoxytitaninum, tetraisopropoxytitanium, tetrabutoxytitanium, tetraisobutoxytitanium, tetra-sec-butoxytitanium, tetra-tert-butoxytitanium and so forth.

Phosphorus compounds can be used for the compound of the dopant element for a silicon semiconductor when the silicon semiconductor is of the p type, and one kind of boron compounds and aluminum compounds can be used when the silicon semicondutor is of the n type.

Those phosphoric acid esters which are in the form of liquid at normal temperature can be used for the phosphorus compound. Examples of such esters include phosphates such as diethyl phosphate, trimethyl phosphate, thiethyl phosphate, tripropyl phosphate, triisopropyl phosphate and tributyl phosphate; phosphites such as trimethyl phosphite, triethyl phosphite, tripropyl phosphite, triisopropyl phosphite and tribuyl phosphite; triethoxy phosphorus; and trimethoxy phosphorus.

Examples of the boron compounds include those which are in the form of liquid at normal temperature such as trimethoxyboron, triethoxyboron, trisopropoxyboron, tripropoxyboron, triisobuthoxyboron, tributhoxyboron, tri-sec-buthoxyboron, tri-tert-buthoxyboron and so forth.

Examples of the aluminum compounds include tri-sec-buthoxyaluminum that is in the form of liquid at normal temperature such as trimethoxyaluminum, triethoxyaluminum, tripropoxyaluminum and tributhoxyaluminum that are in the form of solid at normal temperature and having a melting point around 100° C., and triisopropoxyaluminum that sublimates at around 150° C.

The titanium compound and the compound of the dopant element in a gaseous state are supplied to the surface of a silicon substrate heated to a predetermined temperature.

A bubbling method may be used to bring both compounds into the gaseous state. A bubbler vessel used for this bubbling method generally has a temperature control means. The temperature of the bubbler vessel is set appropriately in accordance with the vapor pressures of the compounds. When the gas reaction system is of an open system and uses an atmospheric pressure, for example, the compounds are contained in a carrier gas to a partial pressure in accordance with the vapor pressure and supplied to a gas feed pipe through a compound feed pipe. Examples of the carrier gas include a $N_2$ gas, a He gas and an AR gas.

The composition ratio (dopant element/titanium atomic number ratio) in titanium oxide containing the dopant element can be controlled by adjusting the feed amounts of the compound of the dopant element and the titanium compound. The feed amounts of both compounds can be controlled with high accuracy by controlling the vapor pressure through the set temperature of the bubbler vessel or by changing the flow rate of the carrier gas passed through the bubbler vessel. Incidentally, the temperature of the bubbler vessel is preferably set from about 90° C. to about 120° C.

In order to reduce surface reflection on a light incident surface and prevent a short-circuit current, the surface of the silicon substrate, to which the two compounds described above are supplied, preferably forms ruggedness having level differences of several to dozens of microns. The formation method of this ruggedness is not particularly limited, and any known methods can be employed. For example, the texture etching method may be carried out using a mixed solution of an aqueous NaOH solution and isopropyl alcohol at a temperature of 80 to 90° C. This method can form very fine pyramidal ruggedness having level differences of several microns on the surface of the silicon substrate. Besides this texture etching method, a method of forming ruggedness by using a dicing device or laser and a dry etching method can be used.

The predetermined heating temperature for the silicon substrate is preferably within the range of 300 to 600° C. Control of the substrate temperature affects the subsequent reaction system. The compound of the dopant element and the titanium compound in a gaseous state supplied to the surface of the silicon substrate are thermally decomposed and oxidized on or near the surface of the silicon substrate. Therefore, the compound of the dopant element changes to the oxide of the dopant element and the titanium compound to titanium oxide. The oxide of the dopant element and titanium oxide may constitute a network and may form a titanium oxide film containing the dopant element on the surface of the silicon substrate. Uniformity of the film thickness of this titanium oxide film can be improved by controlling the temperature to the range described above.

The titanium oxide film containing the dopant element is formed on the surface of the silicon substrate by the method described above. The concentration of the dopant element becomes progressively higher from the surface of this film towards the surface of the silicon substrate. The film thickness of the titanium oxide film is preferably from 65 to 80 nm.

Next, the titanium oxide film must be subjected to heat-treatment. This heat-treatment forms the dopant element diffusion layer having a low sheet resistance in a surface layer of the silicon substrate and a film having a refractive index as high as that of titanium oxide on the outermost surface of the titanium oxide film.

The sheet resistance value is preferably from 30 to 100 $\Omega/\square$. The refractive index is preferably from 2.2 to 2.5 in a region having a low dopant element concentration. The dopant element concentration in the heated titanium oxide film is preferably 80% or less in that of the dopant element diffusion layer.

Since the present invention can simultaneously form the p-n junction and the reflection preventing film, it does not require to deposit a film having a higher refractive index than the reflection preventing film on this reflection preventing film as has been necessary in the prior art. In consequence, the number of process steps can be decreased and the production costs can be reduced.

FIG. 1 shows an example of the composition ratio of the elements that constitute the titanium oxide film according to the present invention. In FIG. 1, a composition ratio of the titanium oxide film at the outermost surface thereof is shown at 0 second of the sputtering time, a composition ratio at an interface between the titanium oxide film and the silicon substrate is shown in the sputtering time range from 0 to 1,118 seconds. FIG. 1 illustrates that the titanium concentration is higher than the phosphorus concentration in the outermost surface and when the sputter time exceeds 500 seconds, the phosphorus concentration increases while the titanium concentration decreases.

Next, one of the features of a production apparatus for producing the titanium oxide film according to the present invention is that a distance (B) from bottom ends of the discharge ports of the dispersion heads for the titanium compound and the atmospheric gas to the surface of the silicon substrate is greater than a distance (A) from a bottom end of the discharge port of the dispersion head for the dopant element compound to the surface of the silicon substrate.

In the production apparatus described above, the compounds that are independently discharged are thermally decomposed on or near the silicon substrate surface. The dopant element compound is decomposed into the oxide of the dopant element and the titanium compound is mixed with the atmospheric gas and turns to titanium oxide. The oxide of the dopant element is first deposited on the silicon substrate surface and then titanium oxide is deposited on the upper side of the oxide of the dopant element. As a result, is formed a titanium oxide film in which the concentration of the dopant element is low in the proximity of the outermost surface of the titanium oxide film containing the dopant element and is high near the silicon substrate.

The difference of the distances (B–A) is preferably from 0.1 to 30 mm.

Heating means for the silicon substrate is not particularly limited, and any known methods can be used. The pressure for the production is not particularly limited, and any of reduced pressure, atmospheric pressure and elevated pressure can be used. Where the film is formed continuously, however, the film is preferably formed under the atmospheric pressure. An $O_2$ gas or a vapor gas can be used as the atmospheric gas. When the $O_2$ gas is used, it is supplied together with a dilution gas. In the case of the vapor gas, the bubbler vessel containing water is kept at about 40° C. to about 99° C., and the carrier gas is then supplied to a carrier gas feed pipe. The vapor is contained to the partial pressure corresponding to the vapor pressure, and supplied together with the dilution gas.

In the apparatus of the present invention, a partition may be formed between the discharge ports of the dispersion heads for the gaseous titanium compound and the atmospheric gas and the silicon substrate and along the circumference of the bottom ends of the discharge ports. In consequence, the titanium compound in a gaseous state and the atmospheric gas discharged from the discharge ports are allowed to reach the surface of the silicon substrate without dissipation. As a result, the titanium compound and the atmospheric gas are prevented from flowing towards an exhaust port before reaching the silicon substrate and the drop of the yield can also be prevented.

The apparatus of the present invention may include conveyor means for conveying the substrate. The conveyor means is preferably constituted in such a fashion as to be capable of conveying the substrate from a position immediately below the discharge port of the discharge head for the dopant element compound through a position immediately below the discharge port of the dispersion head for the titanium compound in a gaseous state to the portion immediately below the discharge port for the atmospheric gas. According to this construction, a film containing the oxide of the dopant element as a main component is first deposited to the surface of the silicon substrate and then a film containing titanium oxide as a main component is deposited thereon. In consequence, the concentration of the titanium oxide film containing the dopant element in the depth-wise direction can be rendered high in the proximity of the silicon substrate and low in the proximity of the outermost surface of the titanium oxide film.

Next, the production method of the titanium oxide film will be explained in detail with reference to a flowchart of the production process shown in FIG. 2 and a production apparatus shown in FIG. 3.

Figure 3:
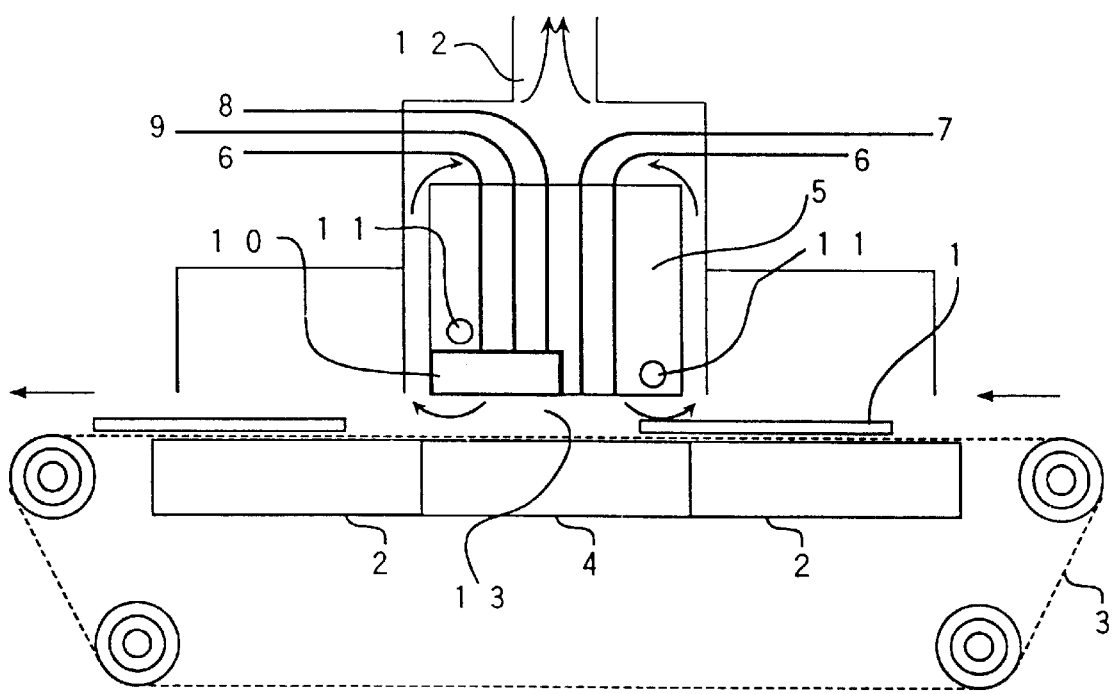
FIG. 3 is a schematic sectional view illustrating the first production apparatus of the present invention.

First, on the surface of the silicon substrate 1, on which ruggedness has been formed as desired (S1), a titanium oxide film containing a dopant element is formed (S2) using an open system continuous atmospheric pressure CVD apparatus shown in FIG. 3.

In the apparatus shown in FIG. 3, the silicon substrate 1 is first pre-heated by a pre-heater 2 and conveyed by a conveyor belt 3 to a film formation position 13. In the film formation 13, a heater 4 sets the film formation temperature. The titanium compound and the compound of the dopant element, both in a gaseous state, are passed through gas lines 7 and 8, respectively, and supplied to the surface of the silicon substrate 1 from a dispersion head 5. The titanium compound and the compound of the dopant element thus supplied are thermally decomposed on the surface of the silicon substrate 1, forming a titanium oxide film. In the apparatus shown in FIG. 3, the conveyor belt 3 conveys the silicon substrate 1 from the position immediately below the discharge port of the dispersion head 5 for the compound of the dopant element, through the position immediately below the discharge port of the gas line 8 for the titanium compound to the position immediately below the discharge port for the atmospheric gas of the gas line 9.

To keep a predetermined vapor pressure, each compound stored in the bubbler vessel is kept at a predetermined temperature. After being contained in a carrier gas to a partial pressure in accordance with the vapor pressure, the gas of each compound is mixed with a dilution gas and is introduced to the film formation position from the respective gas lines.

In FIG. 3, reference numeral 6 denotes a curtain gas (e.g. $N_2$ gas) line.

In the film formation portion 13, exhaust gas that comprises the carrier gas, the dilution gas, the undecomposed starting materials and the decomposition products is discharged from both sides of the dispersion head 5 to an exhaust port 12.

Next, the titanium oxide film is subjected to the heat-treatment. The heat-treatment is preferably conducted at a temperature of 600° C. to 1,200° C. in a nitrogen atmosphere for 10 minutes to 2 hours. This heat-treatment diffuses the dopant element in the titanium oxide film into the silicon substrate to form a dopant diffusion layer. In this way, a p-n junction and an ARC that can be used for a solar cell having a module configuration can be formed simultaneously (S3).

Where the silicon substrate 1 has a p conductivity type, an aluminum paste is preferably applied to a back side of the silicon substrate 1 by screen printing method and fired to form a back side electrode comprising the aluminum paste. Aluminum diffuses from the aluminum paste into the back side of the substrate during this calcining process and forms a back surface field layer.

Where the silicon substrate 1 has an n conductivity type, a silver paste is preferably applied to the back side of the silicon substrate 1 into a comb shape or a fish bone shape by screen printing method, and then fired to form the back side electrode.

The calcining temperature for the back side electrode is preferably within the range of about 600° C. to about 800° C. (S4).

Next, the silver paste is applied preferably into the comb shape or the fish bone shape to a light incident surface by screen printing method, and then fired to form a grid electrode. In this instance, the grid electrode can be brought into contact with the dopant element diffusion layer while penetrating through the titanium oxide film by the effect of a glass frit contained in the silver paste. The calcining temperature for the grid electrode is set preferably within the range of 600° C. to 800° C. Incidentally, the grid electrode can be formed by plating or vapor deposition (S5).

Solder coating is applied to the solar cell thus produced, and lead wires are connected thereto. The solar cell in this state is then sandwiched between EVAs, and a glass and a back side protective sheet are then heat-bonded on the top and the bottom of the solar cell, respectively, to give a super-straight type module.

EXAMPLE 1

Figure 4:
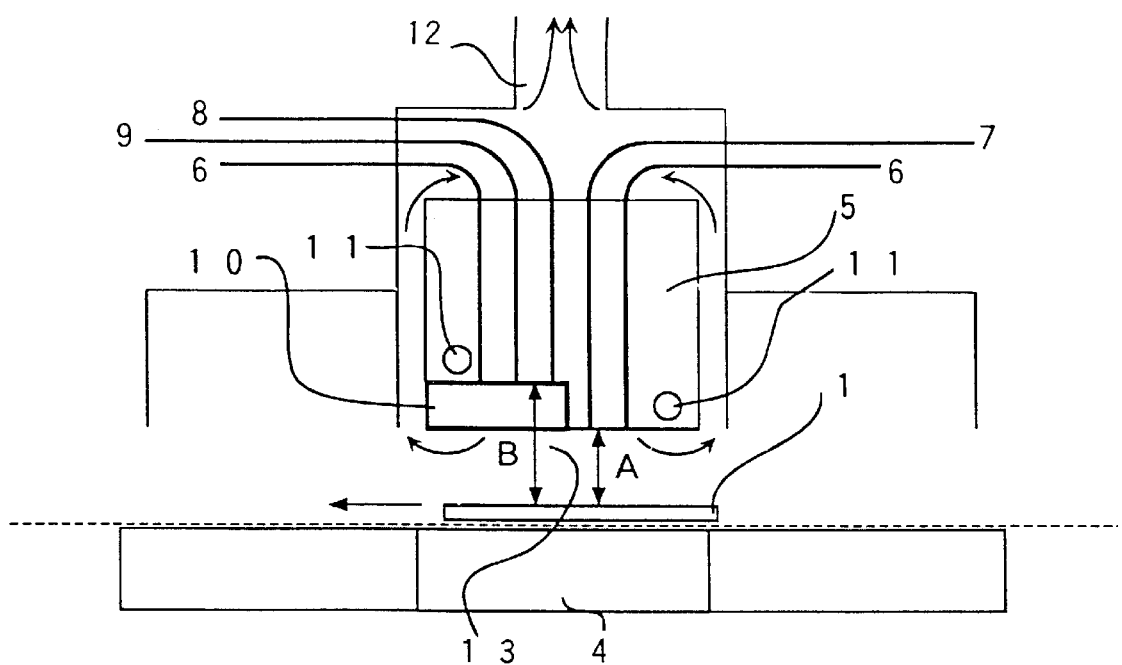
FIG. 4 is a schematic sectional view illustrating the second production apparatus of the present invention.

A titanium oxide film comprising a PTG film was formed using a production apparatus shown in FIGS. 3 and 4 for the analysis of the film.

For the evaluation of a dopant element diffusion layer and a PTG film, a silicon substrate 1 to which ruggedness was formed as described below was used and a p-n junction and a sheet resistance value of an n layer after heat-treatment were measured. To measure a refractive index of the PTG film and to analyze the composition thereof, a mirror substrate without ruggedness was employed.

Ruggedness having level differences of several to dozens of microns was formed on a surface of the silicon substrate 1. The ruggedness was formed by texture etching method using a mixed solution of an aqueous NaOH solution and isopropyl alcohol at a liquid temperature of about 90° C. (S1 in FIG. 2).

After the ruggedness was thus formed on the surface of the silicon substrate 1, a titanium oxide film comprising a PTG film was formed. Diethyl phosphate, for example, was used as a compound of a dopant element for a silicon semiconductor, and a temperature of a bubble vessel storing the compound was set to 65° C. A $N_2$ gas was supplied at a flow rate of 3.0 l/min to a carrier gas feed pipe and the carrier gas was allowed to contain diethyl phosphate to a partial pressure corresponding to the vapor pressure. The $N_2$ gas was then supplied with a dilution $N_2$ gas through a gas line 7 for the compound of the dopant element.

Tetraisopropoxytitanium, for example, was used as a titanium compound and a temperature of a bubbler vessel storing the compound was set to 95° C. The $N_2$ gas was supplied at a flow rate of 1.5l/min to the carrier gas feed pipe. The carrier gas was allowed to contain tetraisopropoxytitanium to a partial pressure corresponding to the vapor pressure, and supplied with the dilution $N_2$ gas through a gas line 8 for the titanium compound.

An $O_2$ gas was used as an atmospheric gas. The flow rate of the $O_2$ gas was 1.5 l/min. The $O_2$ gas was supplied with the $N_2$ for dilution gas through a gas line 9 for the atmospheric gas.

The $N_2$ gas as a curtain gas was supplied at a flow rate of 1.0 l/min though a gas line 6 for the curtain gas.

The silicon substrate 1 was heated by a pre-heater 2 and was conveyed by a conveyor belt 3 to a film formation portion 13. The film formation temperature was set to 350° C. by a heater 4 in the film formation position 13. Tetraisopropoxytitanium and diethyl phosphate, both in a gaseous state, were supplied from the dispersion head 5 to the surface of the silicon substrate 1 through the gas line 8 for the titanium compound and the gas line 7 for the dopant element compound, respectively.

In FIG. 4, a distance A from bottom ends of the discharge ports for the gaseous titanium compound and the atmospheric gas to the surface of the silicon substrate 1 was set to 4 mm, for example, and a distance B from a bottom end of the discharge port for the dopant element compound to the surface of the silicon substrate 1 was set to 14 mm, for example. The difference between A and B was 10 mm.

The silicon substrate 1 was conveyed from the position immediately below the discharge port of the gas line 7 of the dispersion head 5 for the dopant element compound, through the position immediately below the discharge port of the gas line 8 for the titanium compound, and to the position immediately below the discharge port of the gas line 9 for the atmospheric gas (S2 in FIG. 2).

Figure 2:
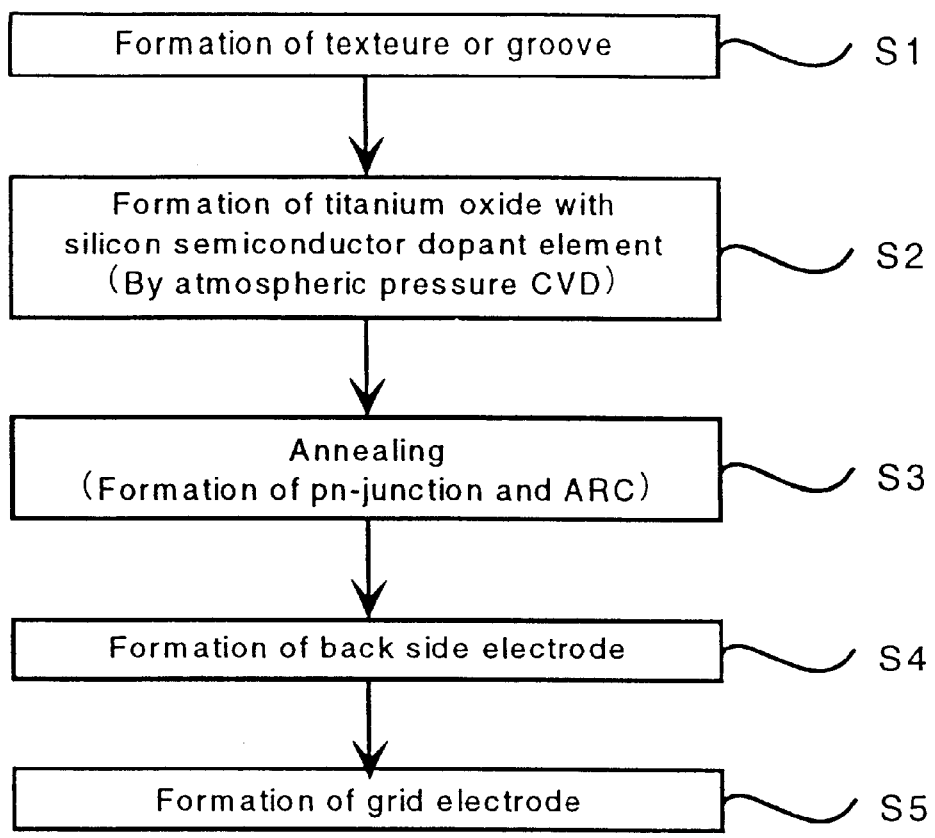
FIG. 2 is a flowchart illustrating a production process of a solar cell utilizing a titanium oxide film of the present invention.

The resulting PTG film having a thickness of about 70 nm was heat-treated at 920° C. in a nitrogen atmosphere for 30 minutes to form a p-n junction originating from the dopant element diffusion layer in the silicon substrate 1 and an ARC on the surface of the silicon substrate 1 simultaneously (S3 in FIG. 2).

The PTG film on the silicon substrate 1 was dissolved and removed by hot concentrated sulfuric acid after the heat-treatment, and the p-n junction was evaluated by a thermo-electromotive force method. The sheet resistance of the n layer was measured by a four-probe method. The refractive index and thickness of the PTG film was measured by using an ellipsometer. This measurement used a CZ mirror substrate (4 inches) having no ruggedness. The PTG film was formed on the silicon substrate 1 having ruggedness and the CZ mirror substrate simultaneously by placing the substrates side by side on the conveyor belt 3. The composition of the PTG film was analyzed using an XPS (X-ray Photoelectron Spectroscopy). Monochromatic Al Kα rays (1486.6 eV) were used as the X-ray source. An Ar gas pressure of $1.5 \times 10^{-7}$ Torr was used for ion etching.

Figure 11:
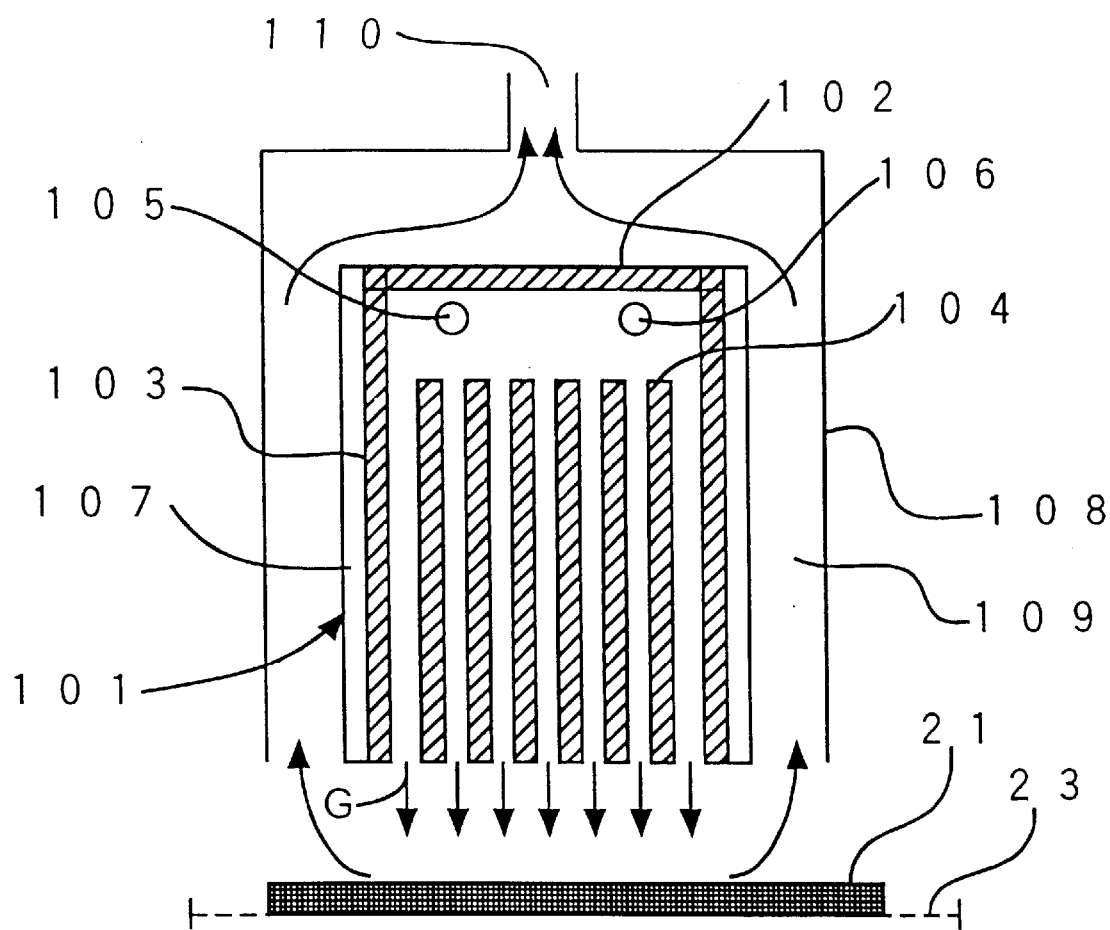
FIG. 11 is a schematic sectional view of a conventional production apparatus.
Figure 12:
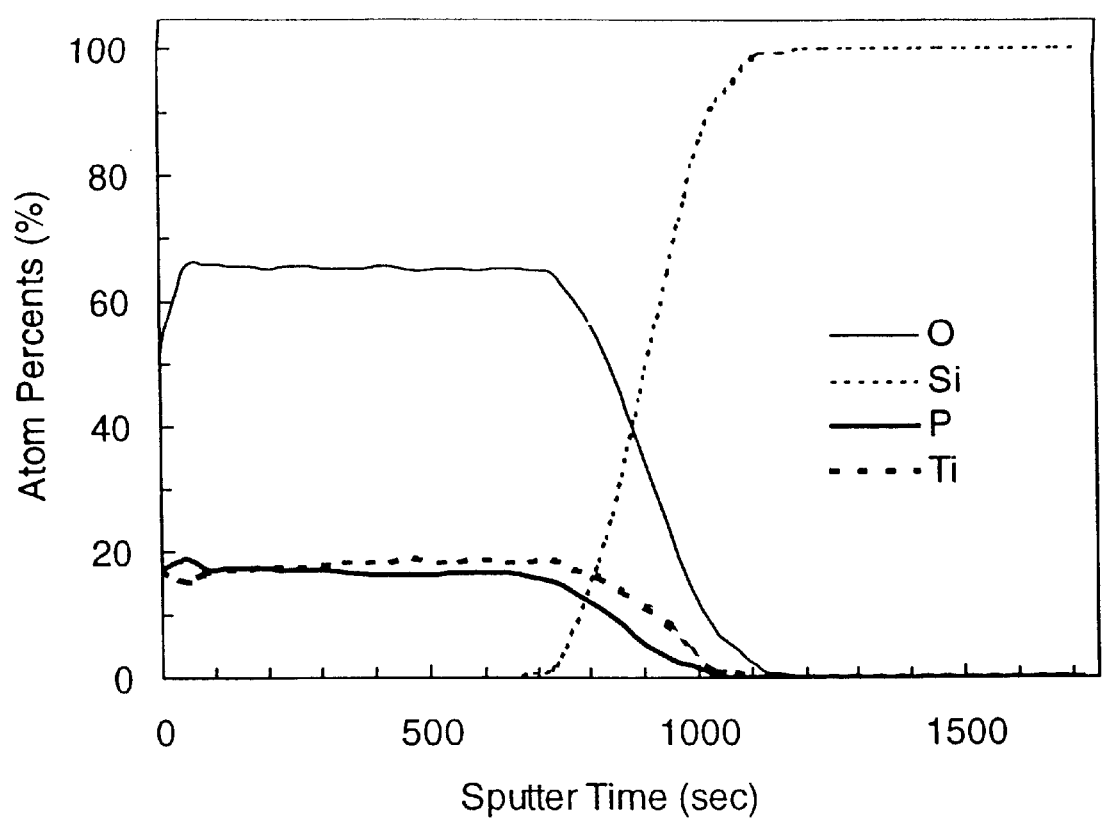
FIG. 12 is a graph illustrating a depth profile of an XPS analysis of a PTG film formed by the conventional production apparatus.

FIGS. 1 and 12 show the results of the depth profile of the XPS analysis of the PTG film formed by using the production apparatus of this example shown in FIG. 3 and the PTG film formed by using the continuous atmospheric CVD apparatus shown in FIG. 11. As shown in FIG. 1, the titanium concentration was higher than the phosphorus concentration in the outermost surface in the example of the present invention. When the sputter time exceeded 500 seconds, the phosphorus concentration increased while the titanium concentration decreased. As a result, the concentration of the dopant element became higher from the surface of the PTG film towards the substrate surface. As shown in FIG. 12, on the other hand, the titanium concentration and the phosphorus concentration remained constant from 0 second to 1,118 seconds of the sputter time in the prior art film.

This result suggested that when the PTG film was formed by using the continuous atmospheric pressure CVD apparatus shown in FIG. 3, oxides of phosphorus were first deposited to the surface of the silicon substrate 1 and titanium oxide was deposited thereon.

Therefore, in the concentration distribution in the depth-wise direction, the phosphorus concentration of the PTG film of this example was higher at portions closer to the silicon substrate 1 and the phosphorus concentration in the outermost surface was low.

Table 1 shows the refractive index of the PTG film of this example and the sheet resistance value of the n layer formed of the PTG film on the surface of the silicon substrate 1. It shows also the refractive index of the conventional PTG film and the sheet resistance value of the n layer formed of the PTG film on the surface of the silicon substrate 1.

TABLE 1

|  | refractive index | sheet resistance (Ω/□) |
| --- | --- | --- |
| prior art | 1.9 | 105 |
| this example | 2.5 | 60 |

As shown in Table 1, the refractive index of the PTG film of this example was 2.5 and the sheet resistance value of the n layer of the silicon substrate 1 formed of the PTG film was 60 Ω/□. The refractive index of the prior art PTG film was 1.9 and the sheet resistance value of the n layer formed of the PTG film on the surface of the silicon substrate 1 was 105 Ω/□.

Here, the sheet resistance value of the n layer had to be kept below about 100 Ω/□ (preferably not greater than about 60 Ω/□) to prevent the drop of a fill factor caused by the increase of the loss of a series resistance owing to the increase of a contact resistance when a grid electrode was formed by using a silver paste. The sheet resistance value of the PTG film according to the prior art was 100 Ω/□ or more. Therefore, unless titanium oxide was deposited on the PTG film by CVD method or the like, the surface reflection could not be reduced effectively.

This example could form the dopant element diffusion layer and the reflection preventing film that satisfied the sheet resistance value of the n layer of 30 to 100 Ω/□ and the optimum refractive index of 2.2 to 2.5 that were necessary for the solar cell for the module.

EXAMPLE 2

Reflection preventing films each comprising a PTG film having a thickness of about 71 nm were formed by using the following phosphorus materials so as to examine the phosphorus materials that could be used as the phosphorus compound.

Phosphoric acid esters such as diethyl phosphate, trimethyl phosphate and triethyl phosphate, and phosphorous acid esters such as trimethyl phosphite, triethyl phosphite, tripropyl phosphite and triisopropyl phosphite were used as the phosphorus compound. The production apparatus of the reflection preventing film, the measurement method and the evaluation method were the same as those used in Example 1.

Table 2 shows the refractive indices of the PTG films of Example 2 and the sheet resistance values of the n layers of the silicon substrate 1 formed from the respective PTG films.

TABLE 2

| phosphorus compound | refractive index | sheet resistance value Ω/□ |
|---|---|---|
| diethyl phosphate | 2.5 | 60 |
| trimethyl phosphate | 2.2 | 30 |
| triethyl phosphate | 2.3 | 64 |
| trimethyl phosphite | 2.2 | 43 |
| triethyl phosphite | 2.3 | 65 |
| tripropyl phosphite | 2.3 | 68 |
| triisopropyl phosphite | 2.5 | 72 |

As shown in Table 2, the refractive index of each PTG film using the phosphorus material was 2.2 to 2.5 and the sheet resistance value of the n layer of the silicon substrate 1 formed from the PTG film was 30 to 72 Ω/□.

Therefore, the phosphorus materials described above could be used for the production of the PTG film. The n layer having a sheet resistance value of 30 to 100 Ω/□ and the reflection preventing film having the optimum refractive index of 2.2 to 2.5, that were required for the solar cell for the module, could be produced.

EXAMPLE 3

Titanium oxide films each having a film thickness of about 73 nm and comprising a boron-containing titanium oxide film were formed on a surface of an n type crystalline silicon substrate 1 using the following boron materials in order to examine the boron materials that could be used as the boron compound.

Trimethoxyboron, triethoxyboron and triisopropoxyboron were used as the boron compound. The film production apparatus of the reflection preventing film, the measurement method and the evaluation method were the same as those used in Example 1.

Table 3 shows the refractive indices of the boron-containing titanium oxide films and the sheet resistance values of the p layers of the silicon substrates 1 formed of the boron-containing titanium oxide films.

TABLE 3

| boron compound | refractive index | sheet resistance Ω/□ |
|---|---|---|
| trimethoxyboron | 2.3 | 68 |
| triethoxyboron | 2.3 | 69 |
| triisopropoxyboron | 2.4 | 67 |

As shown in Table 3, the refractive index of each boron-containing titanium oxide film formed of the boron materials was 2.3 to 2.4, and the sheet resistance value of the p layer of the silicon substrate 1 formed of each boron-containing titanium oxide film was 67 to 69 Ω/□.

Therefore, the boron materials described above could be used for the production of the boron-containing titanium oxide film. The p layer having a sheet resistance value of 30 to 100 Ω/□ and the optimum refractive index of 2.2 to 2.5, that were necessary for the solar cell for the module in which glass and EVA were disposed on the light incident surface, could be formed.

EXAMPLE 4

To examine the construction of the dispersion head in the production apparatus of the titanium oxide film, titanium oxide films each comprising a PTG film having a film thickness of about 72 nm were formed by using the following dispersion heads.

Figure 5:
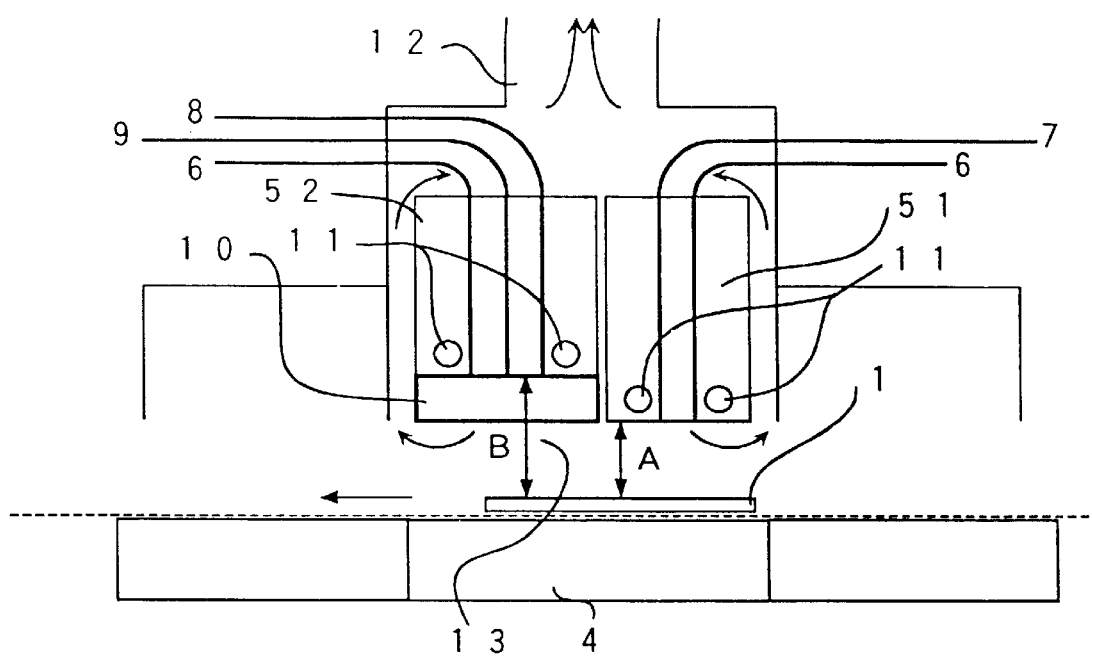
FIG. 5 is a schematic sectional view illustrating the third production apparatus of the present invention.

The dispersion head 5 shown in FIG. 4 was divided into a dispersion head 51 and a dispersion head 52 and cooling pipes 11 were provided to each of them, as shown in FIG. 5. In this case, it became possible to adjust the temperature of the cooling pipe 11 in accordance with the compounds used and to adjust the above-mentioned difference (B−A) of the distances immediately below the dispersion heads. In this example, the temperature was set to the same level of about 105 to 115° C. in order to compare with the construction shown in FIG. 4.

Figure 6:
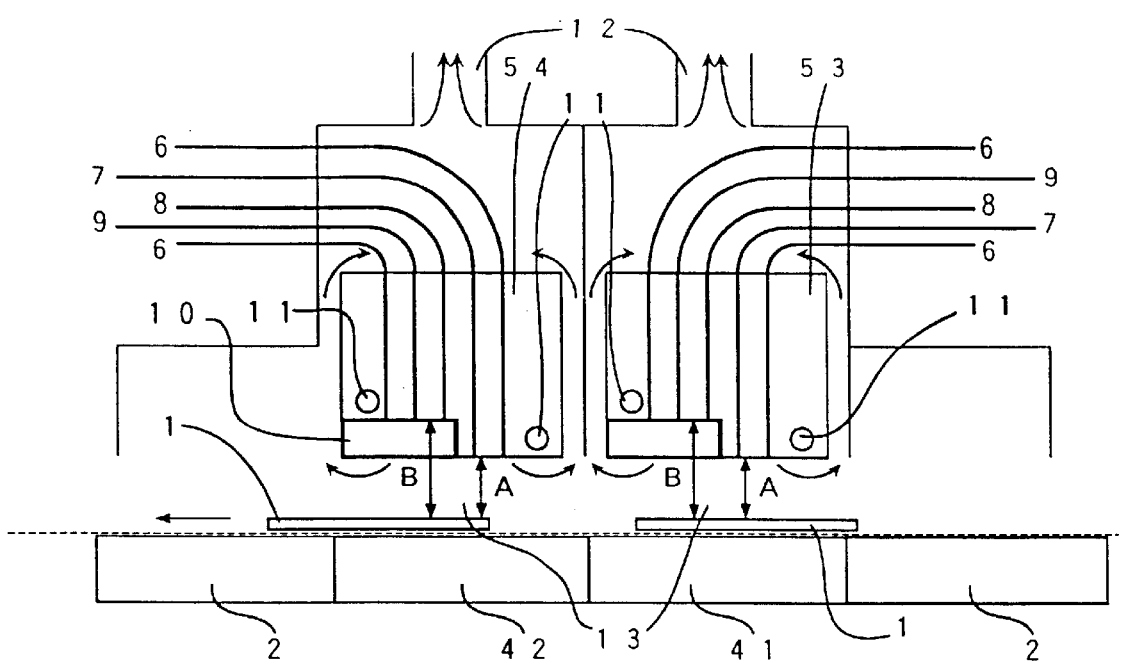
FIG. 6 is a schematic sectional view illustrating the forth production apparatus of the present invention.

Two dispersion heads (53 and 54) each having the same construction as that of the dispersion head 5 shown in FIG. 4 were installed as shown in FIG. 6, and heaters 41 and 42 were provided to each dispersion head. In this case, it became possible to adjust the temperature of the heaters 41 and 42 in accordance with the film formation temperature and to supply the gases having different flow rates to the gas line 7 for the dopant element compound of the silicon semiconductor. In this example, the heater 41 was set to 450° C. and the heater 42 was set to 300° C. The carrier gas was supplied to the dispersion head 53 at a flow rate of 3.0 l/min and at a flow rate of 1.5 l/min to the dispersion head 54 through the gas line 7 for the dopant element compound of the silicon semiconductor.

Table 4 shows the constructions of the production apparatuses shown in FIGS. 4, 5 and 6. A partition 10 was disposed along the circumference of the discharge ports for the titanium compound gas and the atmospheric gas when the difference B−A of the distances immediately below the dispersion head was 0<B−A, and along the circumference of the discharge port of the dopant compound gas when B−A<0.

TABLE 4

| Experiment No. | type | A (mm) | B (mm) | partition |
|---|---|---|---|---|
| T1 | FIG. 4 | 4 | 14 | titanium atmospheric gas |
| T2 | FIG. 4 | 14 | 4 | dopant |
| T3 | FIG. 5 | 4 | 14 | titanium atmospheric gas |
| T4 | FIG. 5 | 14 | 4 | dopant |
| T5 | FIG. 6 | 4 | 14 | titanium atmospheric gas |

The film formation apparatus of the titanium oxide film, the measurement method and the evaluation method were the same as those used in Example 1.

Table 5 shows the refractive indices of the PTG films formed by using the formation apparatus of the titanium oxide film shown in FIG. 4, and the sheet resistance values of the n layers of the silicon substrate 1 formed of the respective PTG films.

TABLE 5

| Experiment No. | refractive index | sheet resistance Ω/□ |
| --- | --- | --- |
| T1 | 2.5 | 60 |
| T2 | 1.8 | n layer was not formed |
| T3 | 2.5 | 60 |
| T4 | 1.8 | n layer was not formed |
| T5 | 2.5 | 30 |

Experiments Nos. T1, T3 and T5 satisfied the conditions that the refractive index of the PTG film was 2.2 to 2.5 and the sheet resistance value of the n layer of the silicon substrate 1 formed of the PTG film was 30 to 100 Ω/□ in Table 5. The result proved unaltered between the case where the dispersion head 5 shown in FIG. 4 was used alone and the case where the dispersion head was divided as shown in FIGS. 5 and 6.

It was assumed from the result shown in Table 5 that in the cases of T2 and T4, titanium oxide was first deposited on the silicon substrate 1 and then the oxide of phosphorus was deposited on the titanium oxide. Therefore, when the difference of the the distance immediately below the dispersion head was B−A<0, the titanium oxide film having a concentration gradient, in which the phosphorus concentration was lower at portions closer to the silicon substrate 1 and was higher in the outermost surface, was formed presumably. It was concluded consequently that the p-n junction was not formed inside the silicon substrate 1 even when the heat-treatment was carried out.

A suitable reflection preventing film could be formed when the difference of the distances immediately below the dispersion head was 0<B−A as described above.

EXAMPLE 5

To examine the difference B−A of the distances immediately below the dispersion head, the differences B−A were set in the following way and titanium oxide films each comprising a PTG film having a film thickness of about 75 nm were formed.

Diethyl phosphate, for example, was used as the phosphorus compound, and the film formation apparatus of the titanium oxide film, the measurement method and the evaluation method were the same as those used in Example 1.

Figure 7:
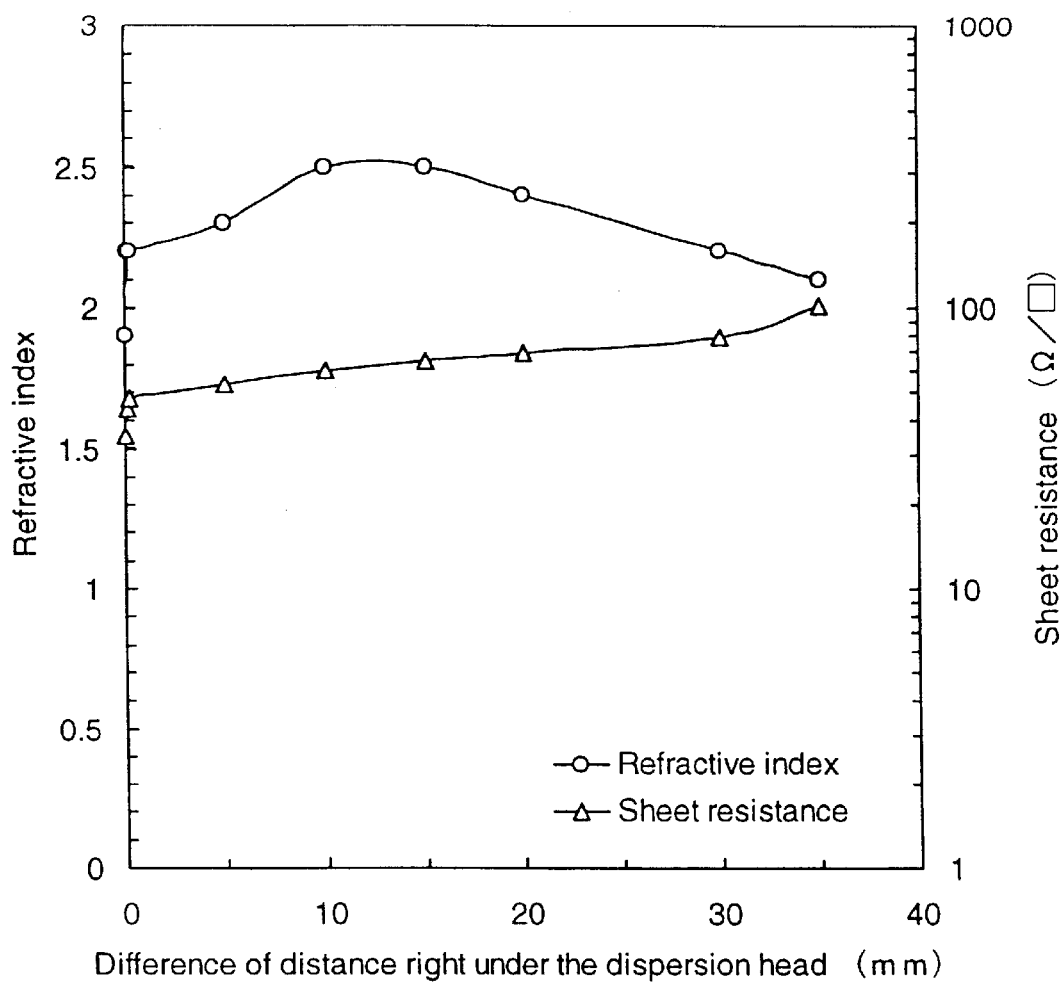
FIG. 7 is a graph illustrating a refractive index of a heated PTG film and a sheet resistance of an n layer of a silicon substrate 1 formed of the PTG film with respect to a difference of distance (B–A) when partition is disposed according to the present invention.

FIG. 7 shows the refractive indices of the PTG films after heat-treatment and the sheet resistance values of the n layers of the silicon substrate 1 formed from the respective PTG films with respect to the difference B−A of the distances immediately below the dispersion head. The films were formed by setting several kinds of differences B−A of the distances immediately below the dispersion head. It was found that the conditions satisfying the refractive index of 2.2 to 2.5 of the PTG film and the sheet resistance value of 30 to 100 Ω/□ of the n layer of the silicon substrate 1 formed from the PTG film were 0.1 to 30 mm.

The reasons were assumed below. When the difference B−A of the distances was 0 mm, the refractive index of the PTG film of this example and the sheet resistance value of the n layer of the silicon substrate 1 formed from this PTG film were believed to be the same as those of the PTG film formed by using the conventional continuous atmospheric pressure CVD apparatus. When the difference B−A of the distances was 35 mm, the film thickness of PTG film became thinner. Therefore, deposition of titanium oxide became more difficult with the distance B−A of more than 30 mm.

Thus by setting the difference B−A of the distances to 0.1 to 30 mm, the n layer having a sheet resistance value of 30 to 100 Ω/□ and the reflection preventing film having an optimum refractive index within the range of 2.2 to 2.5, required for the solar cell for the module, that included glass and EVA on the light incident surface, could be formed.

EXAMPLE 6

The effects of the partitions 10 were examined in the following way.

Diethyl phosphate, for example, was used as the phosphorus compound, and the difference B−A of the distances immediately below the dispersion head was set to the same value as in Example 5. The film formation apparatus, the measurement method and the evaluation method were the same as those in Example 1.

Figure 8:
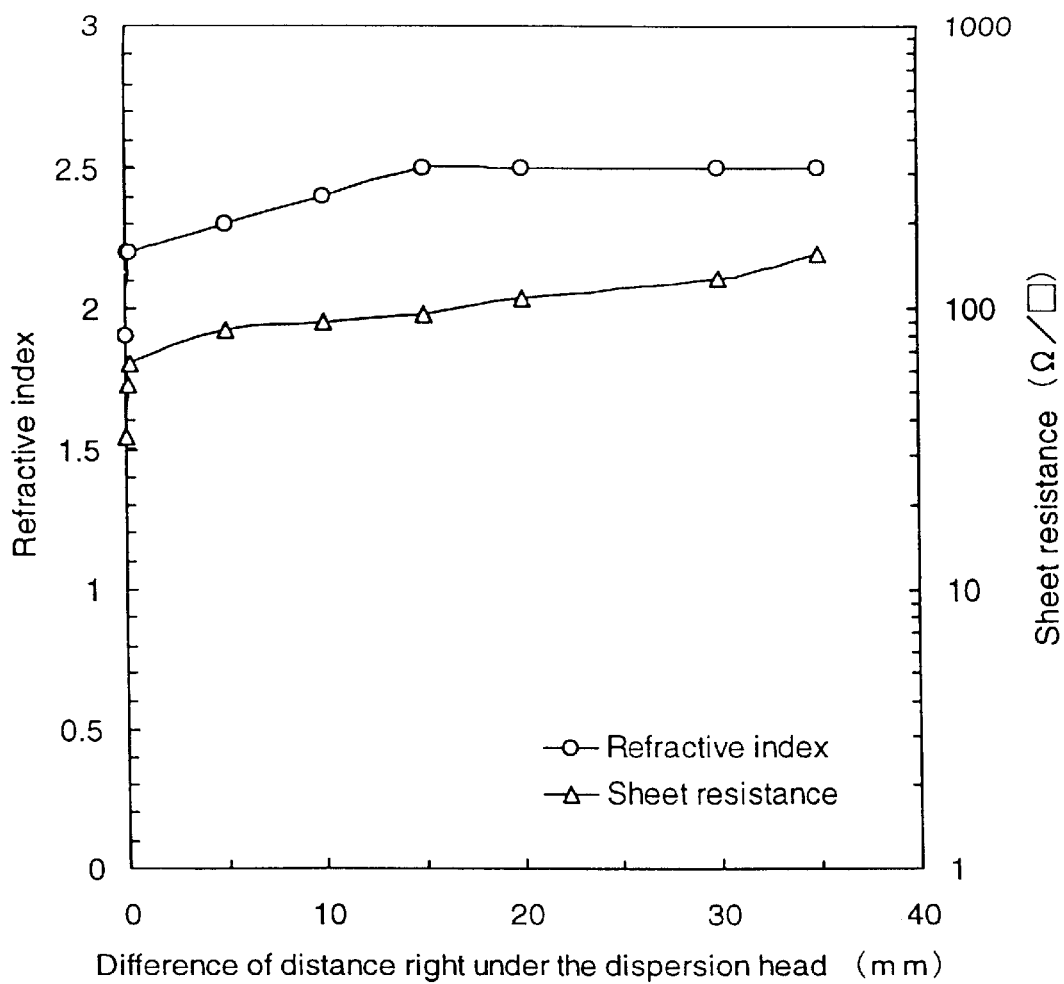
FIG. 8 is a graph illustrating a refractive index of a heated PTG film and a sheet resistance of an n layer of a silicon substrate 1 formed of the PTG film with respect to a difference of distance (B–A) when partition is not disposed according to the present invention.
Figure 9:
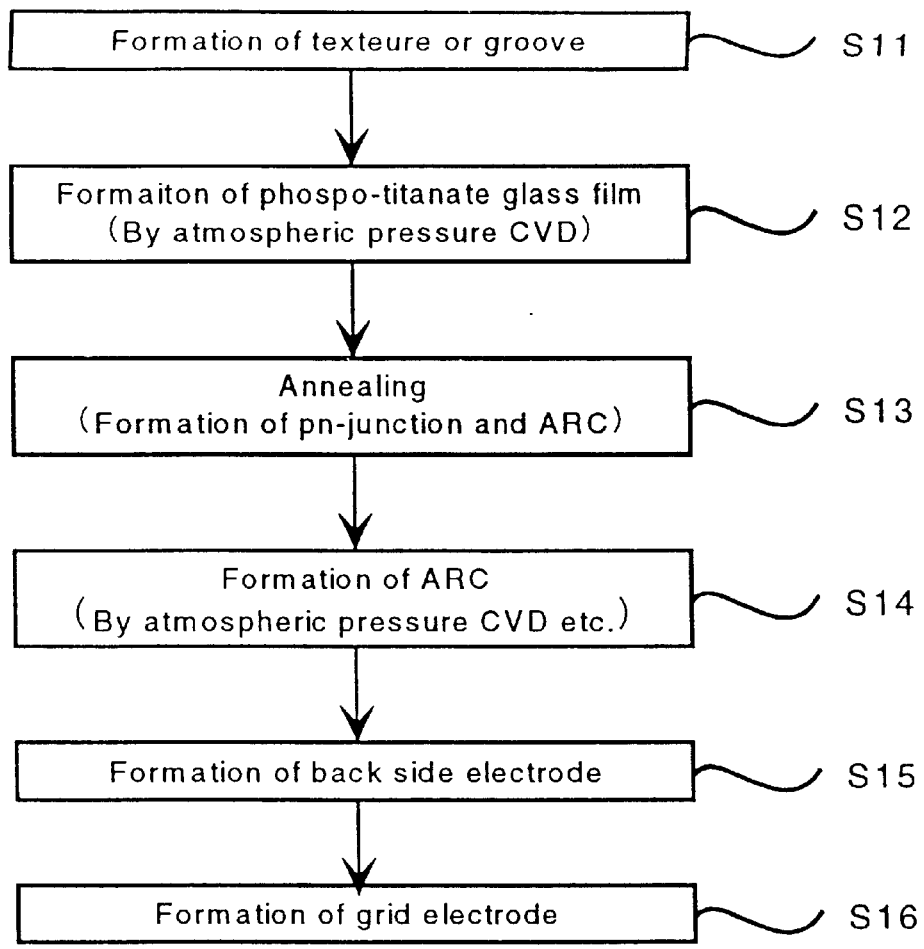
FIG. 9 is a flowchart illustrating a production process of a conventional solar cell.
Figure 10:
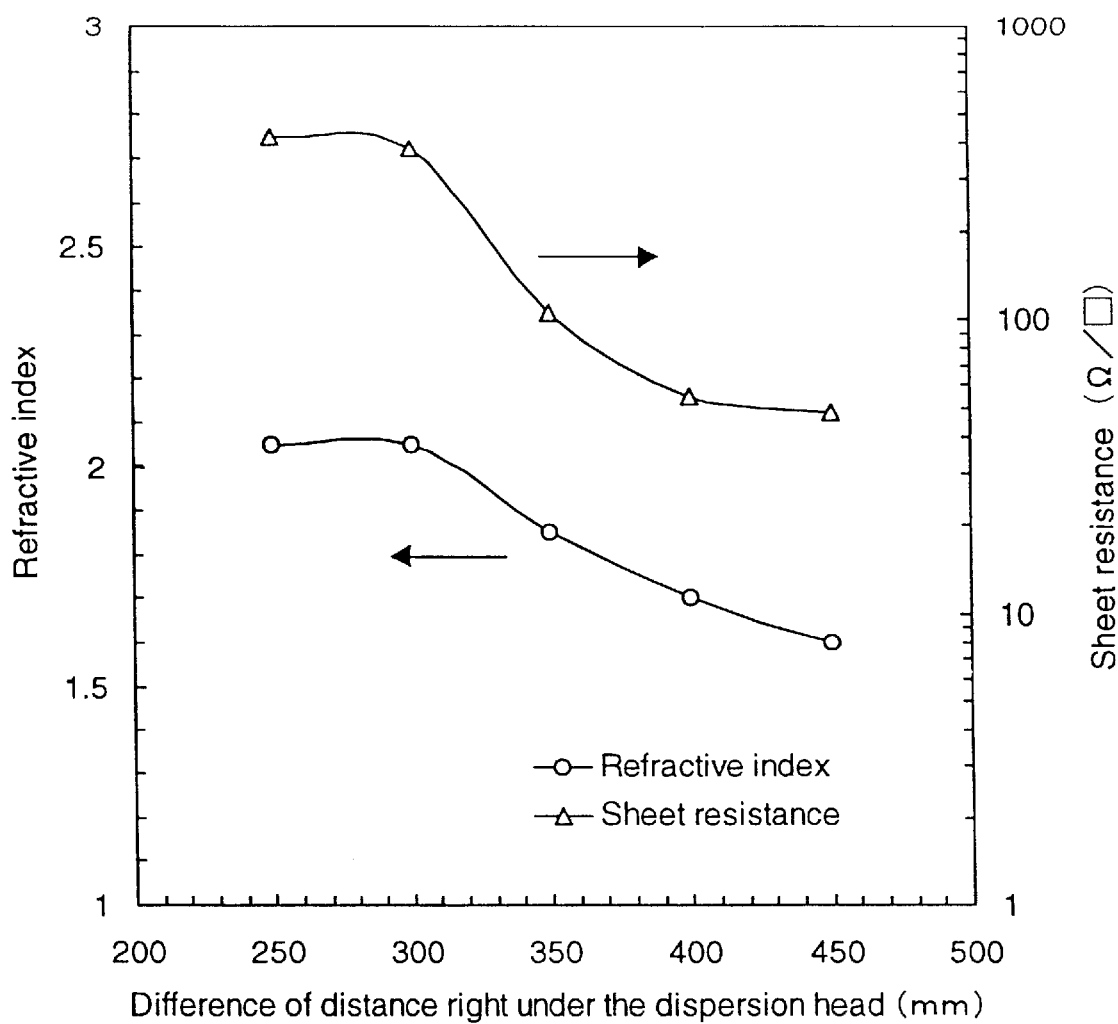
FIG. 10 is a graph illustrating a refractive index of a PTG film formed on a silicon substrate and a sheet resistance of an n layer with respect to a conventional temperature for forming the PTG film.

FIG. 8 shows the refractive index of the PTG film having a film thickness of about 77 nm, that was formed without fitting the partition 10, and the sheet resistance value of the n layer of the silicon substrate 1 formed of the PTG film.

Several kinds of differences B−A of the distances were set and the films were formed. As a result, the difference B−A of the distances of 0.5 to 15 mm satisfied the refractive index of the PTG film of 2.2 to 2.5 and the sheet resistance value of 30 to 100 Ω/□ of the n layer of the silicon substrate 1 formed from the PTG film. In all the cases, however, the sheet resistance value of the n layer was higher than when the partition 10 was provided. Furthermore, as the difference B−A of the distances immediately below the dispersion head became greater, the thickness of the PTG film tended to become smaller.

The reason for the above is considered as follows. When the partition 10 was not disposed, the amounts of the titanium compound and the atmospheric gas flowing to the exhaust port increased before they reached the silicon substrate 1, with the result that phosphorus oxide could not be taken sufficiently.

Thus it became clear that when the partition 10 was not disposed, the formation of the n layer having the sheet resistance value of 30 to 100 Ω/□ and the reflection preventing film having the optimum refractive index within the range of 2.2 to 2.5 necessary for solar batteries for module became more difficult in comparison with Example 5.

EXAMPLE 7

To examine the conveying method of the silicon substrate 1, titanium oxide films each comprising a PTG film having a film thickness of about 78 nm were formed by using the conveying method shown in Table 6.

TABLE 6

| | gas line of dispersion head | | | conveying |
| --- | --- | --- | --- | --- |
| Experiment No. | 7 | 8 | 9 | method |
| T1 | P | Ti | O | 7 → 8 → 9 |
| T6 | p | O | Ti | " |
| T7 | P | Ti | O | 9 → 8 → 7 |
| T8 | P | O | Ti | " |

Diethyl phosphate was used for the phosphorus compound, and the difference B−A of the distances immediately below the dispersion head was set to the same value as in Example 1. The film formation apparatus, the measurement method and the evaluation method were the same as those used in Example 1.

Table 6 shows the refractive indices of the PTG films formed by using the conveying method shown in FIG. 6 and the sheet resistance values of the n layer of the silicon substrate 1 formed of the respective PTG films.

TABLE 7

| Experiment No. | refractive index | sheet resistance Ω/□ |
| --- | --- | --- |
| T1 | 2.5 | 60 |
| T6 | 2.5 | 60 |
| T7 | 1.8 | n layer was not formed |
| T8 | 1.8 | n layer was not formed |

As shown in Table 7, the requirement for the refractive index of the PTG film of 2.2 to 2.5 and the sheet resistance value of 30 to 100 Ω/□ of the n layer of the silicon substrate 1 formed from the PTG film could be satisfied when the substrate 1 was conveyed from a position immediately below the discharge port of the gas line 7 for the dopant element compound of the dispersion head 5, through a position immediately below the discharge head of the ga line 8 for the titanium compound and to a position immediately below the discharge port of the gas line 9 for the atmospheric gas. No influences could be observed by the sequence of the gas lines 7 and 8.

On the other hand, in the cases of T7 and T8 in which the conveying method of the silicon substrate 1 was opposite to the above, titanium oxide was presumably deposited first to the surface of the silicon substrate 1 and then phosphorus oxide was deposited on titanium oxide. Therefore, titanium oxide was presumably formed in which, in the concentration distribution in the depth-wise direction of the PTG film, the phosphorus concentration was lower at portions closer to the silicon substrate 1 and was higher in the outermost surface. It was therefore assumed that the p-n junction could not be formed in the silicon substrate 1 even when the heat-treatment was conducted.

From the above, the optimum titanium oxide film could be formed when the silicon substrate 1 was conveyed from the position immediately below the discharge port of the gas line 7 for the dopant element compound, through the position immediately below the discharge port of the gas line 8 for the titanium compound, and to the position immediately below the discharge port of the gas line 9 for the atmospheric gas.

As can be clearly understood from the explanation given above, in the titanium oxide film according to the present invention, the concentration of the dopant element for the silicon semiconductor is high near the surface of the silicon substrate and is low in the outermost surface. Therefore, the titanium oxide film of the present invention can effectively form the dopant element diffusion layer having a low sheet resistance value in the surface of the silicon substrate and the reflection preventing film having a high refractive index approximate to that of titanium oxide in the outermost surface by a heat-treatment.

By heating the titanium oxide film, the p-n junction and the reflection preventing film for the solar cell for the module can be formed simultaneously. Therefore, it is not necessary to deposit uniformly a film having a higher refractive index than that of the reflection preventing film onto this film by CVD method or the like. As a result, the number of process steps can be decreased, the process can be simplified, and the production costs can be reduced.

The production apparatus according to the present invention can easily form the titanium oxide film.

Owing to the partition disposed in the production apparatus, it becomes possible to prevent the titanium compound and the atmospheric gas from flowing into the exhaust port before reaching the silicon substrate, and to thus prevent the drop of the yield.

Since the production apparatus includes conveying means for conveying the silicon substrate in the specific sequence, the titanium oxide film according to the present invention can be acquired more easily.

In consequence, the present invention can remarkably simplify the production process of the solar cell for the module, particularly the formation steps of the p-n junction and the reflection preventing film, and can economically provide them. Therefore, the present invention has extremely great industrial significance.

What is claimed is:

1. A titanium oxide film containing a dopant element formed on a silicon substrate by supplying a titanium compound for forming the titanium oxide film and a compound of a dopant element for a silicon semiconductor in a gaseous state to a surface of the silicon substrate heated to a predetermined temperature, wherein the concentration of the dopant element in the titanium oxide film becomes progressively higher from the surface of the titanium oxide film to the surface of the silicon substrate.

2. A titanium oxide film according to claim 1, wherein the predetermined temperature is 300 to 600° C.

3. A titanium oxide film according to claim 1, wherein the titanium compound is a titanium alkoxide and the compound of the dopant element is a phosphorus compound, a boron compound or an aluminum compound.

4. A titanium oxide film according to claim 1, wherein the titanium oxide film has a thickness of 65 to 80 nm.

5. A titanium oxide film formed by heating the titanium oxide film formed on the silicon substrate of claim 1 at a predetermined temperature to diffuse the dopant element in the silicon substrate so as to form a dopant element diffusion layer, wherein the dopant element diffused layer has a sheet resistance of 30 to 100 Ω/□ and the heated titanium oxide film has a refractive index of 2.2 to 2.5 in a region where the dopant element concentration is low.

\* \* \* \* \*